(12) United States Patent
Katoh et al.

(10) Patent No.: US 8,059,222 B2
(45) Date of Patent: Nov. 15, 2011

(54) DISPLAY DEVICE AND METHOD FOR MANUFACTURING THE SAME

(75) Inventors: Hiromi Katoh, Osaka (JP); Benjamin James Hadwen, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 158 days.

(21) Appl. No.: 12/668,866

(22) PCT Filed: Jul. 11, 2008

(86) PCT No.: PCT/JP2008/062592
§ 371 (c)(1),
(2), (4) Date: Jan. 12, 2010

(87) PCT Pub. No.: WO2009/011310
PCT Pub. Date: Jan. 22, 2009

(65) Prior Publication Data
US 2010/0181570 A1    Jul. 22, 2010

(30) Foreign Application Priority Data
Jul. 19, 2007   (JP) ................................. 2007-188534

(51) Int. Cl.
*G02F 1/136*   (2006.01)
(52) U.S. Cl. ................ 349/43; 349/25; 349/42; 349/44; 349/45; 349/47
(58) Field of Classification Search .................... 349/24, 349/25, 42, 43, 44, 45, 47
See application file for complete search history.

(56) References Cited

U.S. PATENT DOCUMENTS

| | | | |
|---|---|---|---|
| 6,211,509 B1 * | 4/2001 | Inoue et al. | 250/208.1 |
| 6,930,299 B2 * | 8/2005 | Ohkawa | 250/208.1 |
| 2005/0045881 A1 | 3/2005 | Nakamura et al. | |
| 2006/0138421 A1 | 6/2006 | Tada | |
| 2006/0258080 A1 | 11/2006 | Takahashi | |
| 2009/0050891 A1 | 2/2009 | Katoh | |
| 2010/0066877 A1 * | 3/2010 | Yamaguchi et al. | 348/279 |

OTHER PUBLICATIONS

International Search Report for PCT/JP2008/062592, mailed Oct. 21, 2008.

* cited by examiner

*Primary Examiner* — Jennifer Doan
(74) *Attorney, Agent, or Firm* — Nixon & Vanderhye, P.C.

(57) ABSTRACT

An active matrix substrate in which variations in output characteristics of photodiodes are reduced, and a display device using this active matrix substrate, are provided. An active matrix substrate (1) having an n-TFT (20), a p-TFT (30), and a photodiode (10) is used. The photodiode (10) includes a p-layer (7), an i-layer (8), and an n-layer (9). The i-layer (8) includes a p-type semiconductor region (8a) at a position adjacent to the player (7), said p-type semiconductor region (8a) having a diffusion concentration of p-type impurities that is set at the same level as that of a diffusion concentration of p-type impurities in the channel region (23) of the n-TFT (20); and an n-type semiconductor region (8b) at a position adjacent to the n-layer (9), said n-type semiconductor region (8b) having a diffusion concentration of n-type impurities that is set at the same level as that of a diffusion concentration of n-type impurities in the channel region (33) of the p-TFT (30).

4 Claims, 6 Drawing Sheets

DISPLAY DEVICE AND METHOD FOR MANUFACTURING THE SAME

This application is the U.S. national phase of International Application No. PCT/JP2008/062592 filed 11 Jul. 2008, which designated the U.S. and claims priority to Japan Application No. 2007-188534 filed 19 Jul. 2007, the entire contents of each of which are hereby incorporated by reference.

TECHNICAL FIELD

The present invention relates to a display device provided with a photodiode, and a method for manufacturing the display device.

BACKGROUND ART

In the field of display devices typified by liquid crystal display devices, a brightness of a display screen of a display device is adjusted according to an intensity of ambient light of the display device (hereinafter this light is referred to as "external light"). Therefore, to incorporate a light sensor in the display device has been proposed. The incorporation of the light sensor in the display device can be achieved by mounting a light sensor as a discrete component on a display panel thereof. Further, in the case of a liquid crystal display device, a light sensor can be formed monolithically on an active matrix substrate by utilizing a process for forming an active element (TFT) and a peripheral circuit.

In the field of display devices for mobile terminal devices in particular, the light sensor is required to be formed monolithically on the active matrix substrate, from the viewpoint of reducing the number of components and downsizing a display device. As the light sensor formed monolithically, a photodiode having a lateral structure, for example, is known (see, for example, JP 2006-3857 A).

Figure 6:
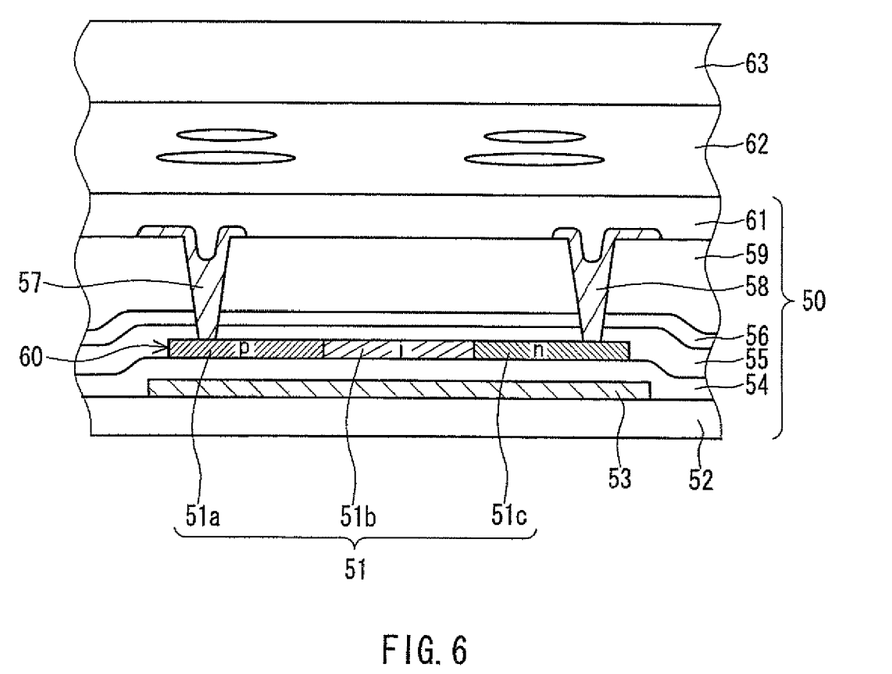
FIG. 6 is a cross-sectional view showing a conventional configuration of a photodiode.

Here, a conventional photodiode (light sensor) is described with reference to FIG. 6. FIG. 6 is a cross-sectional view showing a configuration of a conventional photodiode. As shown in FIG. 6, a photodiode 51 is a PIN diode having the lateral structure. In the example shown in FIG. 6, the photodiode 51 is formed monolithically on the active matrix substrate included in a liquid crystal display panel.

As shown in FIG. 6, the photodiode 51 has a silicon film 60 provided on a glass substrate 52 serving as a base substrate of an active matrix substrate 50. The silicon film 60 is formed at the same time when the thin film transistor (TFT) functioning as the active element is formed, by utilizing the step for forming the TFT. In the silicon film 60, a p-type semiconductor region (p-layer) 51a, an intrinsic semiconductor region (i-layer) 51b, and an n-type semiconductor region (n-layer) 51c are provided in a plane direction in the stated order. In this photodiode 51, the i-layer 51b serves as a light detection region.

The i-layer 51b is a region electrically almost neutral, as compared with the adjacent p-layer 51a and n-layer 51c, and is formed by an ion implantation step performed in a process for forming active elements (TFT) or peripheral circuits in such a manner that a conductive electron density and a positive hole density are equal to each other. Further, below the photodiode 51, a light blocking film 53 for blocking illumination light from a backlight device is provided, with a basecoat film 54 being interposed between the photodiode 51 and the light blocking film 53. The photodiode 51 is covered with interlayer insulation films 55 and 56.

In FIG. 6, "57" denotes a line connected with the p-layer 51a, "58" denotes a line connected with the n-layer 51c. Further, "59" denotes a flattening film, and "61" denotes a protective film. "62" denotes a liquid crystal layer. Regarding a counter substrate 63, only its outline is shown.

In the photodiode 51 shown in FIG. 6, depletion layers are formed between the p-layer 51a and the i-layer 51b, and between the n-layer 51c and the i-layer 51b. When light enters the i-layer 51b while a reverse bias voltage is being applied across opposite ends of the photodiode 51, free electrons in each of the depletion layers move toward the n-layer 51c, and positive holes move toward the p-layer 51a. As a result, a photoelectric current is outputted from the photodiode 51.

DISCLOSURE OF INVENTION

Problem to be Solved by the Invention

The photodiode 51 shown in FIG. 6, however, has a problem that output characteristics tend to vary from a photodiode to a photodiode. For example, a problem arises in that, as to photodiodes that are produced to the same specifications and are formed on respective display devices, and as to a plurality of photodiodes that are produced to the same specifications and are formed on the same active matrix substrate, output characteristics vary from a photodiode to a photodiode. Further, if output characteristics vary, it becomes difficult to adjust brightness of the display screen by using a light sensor, and to retrieve images at high image quality. It should be noted that the "output characteristic" refers to the relationship between a photoelectric current and a reverse bias voltage, that is, the I-V characteristic.

Such variations in output characteristics attribute to, for example, errors upon formation of each semiconductor area. More specifically, a semiconductor area is formed by implantation of impurities into a silicon film by ion implantation, and herein errors occur as to the amount of impurities to be implanted, the depth at which the impurities are implanted., etc. These errors cause the diffusion concentration of impurities in each semiconductor area to vary, thereby causing an energy gap at an interface between semiconductor areas to vary. This results in variations also in output characteristics of photodiodes. As the number of ion implantation steps is greater, the variations in the concentration as a result of diffusion become greater. This causes the variations in the output characteristic to increase further, too.

It is an object of the present invention to resolve the above-described problem, to suppress variations in output characteristics of photodiodes in an active matrix substrate and a display device having photodiodes.

Means for Solving Problem

In order to achieve the above-described object, an active matrix substrate of the present invention is an active matrix substrate that includes an n-type thin film transistor, a p-type thin film transistor, and a photodiode, wherein the n-type thin film transistor includes a silicon film in which an n-type semiconductor region that will become a source region, an n-type semiconductor region that will become a drain region, and a p-type semiconductor region that will become a channel region are formed; the p-type thin film transistor includes a silicon film in which a p-type semiconductor region that will become a source region, a p-type semiconductor region that will become a drain region, and an n-type semiconductor region that will become a channel region are formed; the photodiode includes a silicon film in which a p-type semiconductor region, an intrinsic semiconductor region, and an n-type semiconductor region are formed, and the p-type semiconductor region and the n-type semiconductor region of the photodiode are arranged so that the intrinsic semiconductor region is interposed therebetween in a plane direction of the silicon film of the photodiode; and the intrinsic semiconductor region includes: a p-type semiconductor region at a position adjacent to the p-type semiconductor region of the photodiode, said p-type semiconductor region having a diffusion concentration of p-type impurities that is set at the same level as that of a diffusion concentration of p-type impurities in the channel region of the n-type thin film transistor; and an n-type semiconductor region at a position adjacent to the n-type semiconductor region of the photodiode, said n-type semiconductor region having a diffusion concentration of n-type impurities that is set at the same level as that of a diffusion concentration of n-type impurities in the channel region of the p-type thin film transistor.

Further, to achieve the above-described object, a display device of the present invention is a display device that includes an active matrix substrate, wherein the active matrix substrate comprises an n-type thin film transistor, a p-type thin film transistor, and a photodiode, wherein the n-type thin film transistor includes a silicon film in which an n-type semiconductor region that will become a source region, an n-type semiconductor region that will become a drain region, and a p-type semiconductor region that will become a channel region are formed; the p-type thin film transistor includes a silicon film in which a p-type semiconductor region that will become a source region, a p-type semiconductor region that will become a drain region, and an n-type semiconductor region that will become a channel region are formed; the photodiode includes a silicon film in which a p-type semiconductor region, an intrinsic semiconductor region, and an n-type semiconductor region are formed, and the p-type semiconductor region and the n-type semiconductor region of the photodiode are arranged so that the intrinsic semiconductor region is interposed therebetween in a plane direction of the silicon film of the photodiode; and the intrinsic semiconductor region includes: a p-type semiconductor region at a position adjacent to the p-type semiconductor region of the photodiode, said p-type semiconductor region having a diffusion concentration of p-type impurities that is set at the same level as that of a diffusion concentration of p-type impurities in the channel region of the n-type thin film transistor; and an n-type semiconductor region at a position adjacent to the n-type semiconductor region of the photodiode, said n-type semiconductor region having a diffusion concentration of n-type impurities that is set at the same level as that of a diffusion concentration of n-type impurities in the channel region of the p-type thin film transistor.

Still further, to achieve the above-described object, a first method of the present invention for producing a display device includes the steps of: (a) forming an n-type silicon film on a base substrate for forming an active matrix substrate; (b) removing a part of the n-type silicon film, and forming a first silicon film that will become an n-type thin film transistor, a second silicon film that will become a p-type thin film transistor, and a third silicon film that will become a photodiode; (c) introducing n-type impurities into portions of the first silicon film that will become a source region and a drain region of the n-type thin film transistor, and a portion of the third silicon film that will become an n-type semiconductor region of the photodiode; (d) introducing p-type impurities into portions of the second silicon film that will become a source region and a drain region of the p-type thin film transistor, and a portion of the third silicon film that will become a p-type semiconductor region of the photodiode; and (e) introducing p-type impurities into a portion of the first silicon film that will become a channel region of the n-type thin film transistor, and a portion of the third silicon film that will become a part of an intrinsic region of the photodiode, the part being on a side to the p-type semiconductor region of the photodiode, in such a manner that a lower diffusion concentration of the p-type impurities than in the step (d) is obtained, wherein in each of the steps (c) to (e), a mask for preventing introduction of the p-type impurities and the n-type impurities is provided over a portion of the second silicon film that will become a channel region of the p-type thin film transistor and a portion of the third silicon film that will become a part of the intrinsic semiconductor region of the photodiode, the part being on a side to the n-type semiconductor region of the photodiode.

To achieve the above-described object, a second method of the present invention for producing a display device includes the steps of: (a) forming a p-type silicon film on a base substrate for forming an active matrix substrate; (b) removing a part of the p-type silicon film, and forming a first silicon film that will become an n-type thin film transistor, a second silicon film that will become a p-type thin film transistor, and a third silicon film that will become a photodiode; (c) introducing n-type impurities into portions of the first silicon film that will become a source region and a drain region of the n-type thin film transistor, and a portion of the third silicon film that will become an n-type semiconductor region of the photodiode; (d) introducing p-type impurities into portions of the second silicon film that will become a source region and a drain region of the p-type thin film transistor, and a portion of the third silicon film that will become a p-type semiconductor region of the photodiode; and (e) introducing n-type impurities into a portion of the second silicon film that will become a channel region of the p-type thin film transistor, and a portion of the third silicon film that will become a part of an intrinsic region of the photodiode, the part being on a side to the n-type semiconductor region of the photodiode, in such a manner that a lower diffusion concentration of the n-type impurities than in the step (c) is obtained, wherein in each of the steps (c) to (e), a mask for preventing introduction of the p-type impurities and the n-type impurities is provided over a portion of the first silicon film that will become a channel region of the n-type thin film transistor and a portion of the third silicon film that will become a part of the intrinsic semiconductor region of the photodiode, the part being on a side to the p-type semiconductor region of the photodiode.

Effects of the Invention

According to the present invention, in an active matrix substrate and a display device provided with photodiodes, variations in output characteristics of the photodiodes can be reduced.

BRIEF DESCRIPTION OF DRAWINGS

FIGS. 3A to 3C respectively show serial principal steps of the producing method.

FIGS. 4A and 4B show serial principal steps of the present invention that are carried out after the step shown in FIG. 3C is finished.

FIGS. 5A and 5B show serial principal steps of the present invention that are carried out after the step shown in FIG. 4B is finished.

DESCRIPTION OF THE INVENTION

An active matrix substrate according to an embodiment of the present invention is an active matrix substrate that includes an n-type thin film transistor, a p-type thin film transistor, and a photodiode, wherein the n-type thin film transistor includes a silicon film in which an n-type semiconductor region that will become a source region, an n-type semiconductor region that will become a drain region, and a p-type semiconductor region that will become a channel region are formed; the p-type thin film transistor includes a silicon film in which a p-type semiconductor region that will become a source region, a p-type semiconductor region that will become a drain region, and an n-type semiconductor region that will become a channel region are formed; the photodiode includes a silicon film in which a p-type semiconductor region, an intrinsic semiconductor region, and an n-type semiconductor region are formed, and the p-type semiconductor region and the n-type semiconductor region of the photodiode are arranged so that the intrinsic semiconductor region is interposed therebetween in a plane direction of the silicon film of the photodiode; and the intrinsic semiconductor region includes: a p-type semiconductor region at a position adjacent to the p-type semiconductor region of the photodiode, said p-type semiconductor region having a diffusion concentration of p-type impurities that is set at the same level as that of a diffusion concentration of p-type impurities in the channel region of the n-type thin film transistor; and an n-type semiconductor region at a position adjacent to the n-type semiconductor region of the photodiode, said n-type semiconductor region having a diffusion concentration of n-type impurities that is set at the same level as that of a diffusion concentration of n-type impurities in the channel region of the p-type thin film transistor.

According to this configuration, a portion on the p-type semiconductor region side in the intrinsic semiconductor region of the photodiode is formed so as to have a diffusion concentration of impurities at the same level as that of the diffusion concentration of p-type impurities in the channel region of the n-type thin film transistor. Further, in the present invention, a portion on the n-type semiconductor region side in the intrinsic semiconductor region of the photodiode is formed so as to have a diffusion concentration of impurities at the same level as that of the diffusion concentration of n-type impurities in the channel region of the p-type thin film transistor. Further, since the silicon film originally is either p-type or n-type, a channel region can be formed without introduction of additional impurities, in either the p-type thin film transistor or the n-type thin film transistor described above.

Therefore, with the above-described configuration, in the intrinsic semiconductor region of the photodiode, either a portion thereof adjacent to the p-type semiconductor region or a portion thereof adjacent to the n-type semiconductor region can be formed without introduction of impurities, and hence a photodiode is formed through a fewer ion implantation steps as compared with conventional cases. Thus, with the above-described configuration, variations in a diffusion concentration in the intrinsic semiconductor region can be reduced as compared with conventional cases. Consequently, variations in the energy gap at an interface between the p-type or n-type semiconductor region and the intrinsic semiconductor region of the photodiode also are smaller as compared with conventional cases, whereby variations in the output characteristics of the photodiode also are reduced.

A display device having the active matrix substrate in the above-described configuration also is an embodiment of the present invention.

A first method for producing a display device in the above-described configuration includes the steps of: (a) forming an n-type silicon film on a base substrate for forming an active matrix substrate; (b) removing a part of the n-type silicon film, and forming a first silicon film that will become an n-type thin film transistor, a second silicon film that will become a p-type thin film transistor, and a third silicon film that will become a photodiode; (c) introducing n-type impurities into portions of the first silicon film that will become a source region and a drain region of the n-type thin film transistor, and a portion of the third silicon film that will become an n-type semiconductor region of the photodiode; (d) introducing p-type impurities into portions of the second silicon film that will become a source region and a drain region of the p-type thin film transistor, and a portion of the third silicon film that will become a p-type semiconductor region of the photodiode; and (e) introducing p-type impurities into a portion of the first silicon film that will become a channel region of the n-type thin film transistor, and a portion of the third silicon film that will become a part of an intrinsic region of the photodiode, the part being on a side to the p-type semiconductor region of the photodiode, in such a manner that a lower diffusion concentration of the p-type impurities than in the step (d) is obtained, wherein in each of the steps (c) to (e), a mask for preventing introduction of the p-type impurities and the n-type impurities is provided over a portion of the second silicon film that will become a channel region of the p-type thin film transistor and a portion of the third silicon film that will become a part of the intrinsic semiconductor region of the photodiode, the part being on a side to the n-type semiconductor region of the photodiode.

A second method for producing a display device in the above-described configuration includes the steps of: (a) forming a p-type silicon film on a base substrate for forming an active matrix substrate; (b) removing a part of the p-type silicon film, and forming a first silicon film that will become an n-type thin film transistor, a second silicon film that will become a p-type thin film transistor, and a third silicon film that will become a photodiode; (c) introducing n-type impurities into portions of the first silicon film that will become a source region and a drain region of the n-type thin film transistor, and a portion of the third silicon film that will become an n-type semiconductor region of the photodiode; (d) introducing p-type impurities into portions of the second silicon film that will become a source region and a drain region of the p-type thin film transistor, and a portion of the third silicon film that will become a p-type semiconductor region of the photodiode; and (e) introducing n-type impurities into a portion of the second silicon film that will become a channel region of the p-type thin film transistor, and a portion of the third silicon film that will become a part of an intrinsic region of the photodiode, the part being on a side to the n-type semiconductor region of the photodiode, in such a manner that a lower diffusion concentration of the n-type impurities than in the step (c) is obtained, wherein in each of the steps (c) to (e), a mask for preventing introduction of the p-type impurities and the n-type impurities is provided over a portion of the first silicon film that will become a channel region of the n-type thin film transistor and a portion of the third silicon film that will become a part of the intrinsic semiconductor region of the photodiode, the part being on a side to the p-type semiconductor region of the photodiode.

Hereinafter, a more specific embodiment of the present invention will be described with reference to the drawings.

Figure 1:
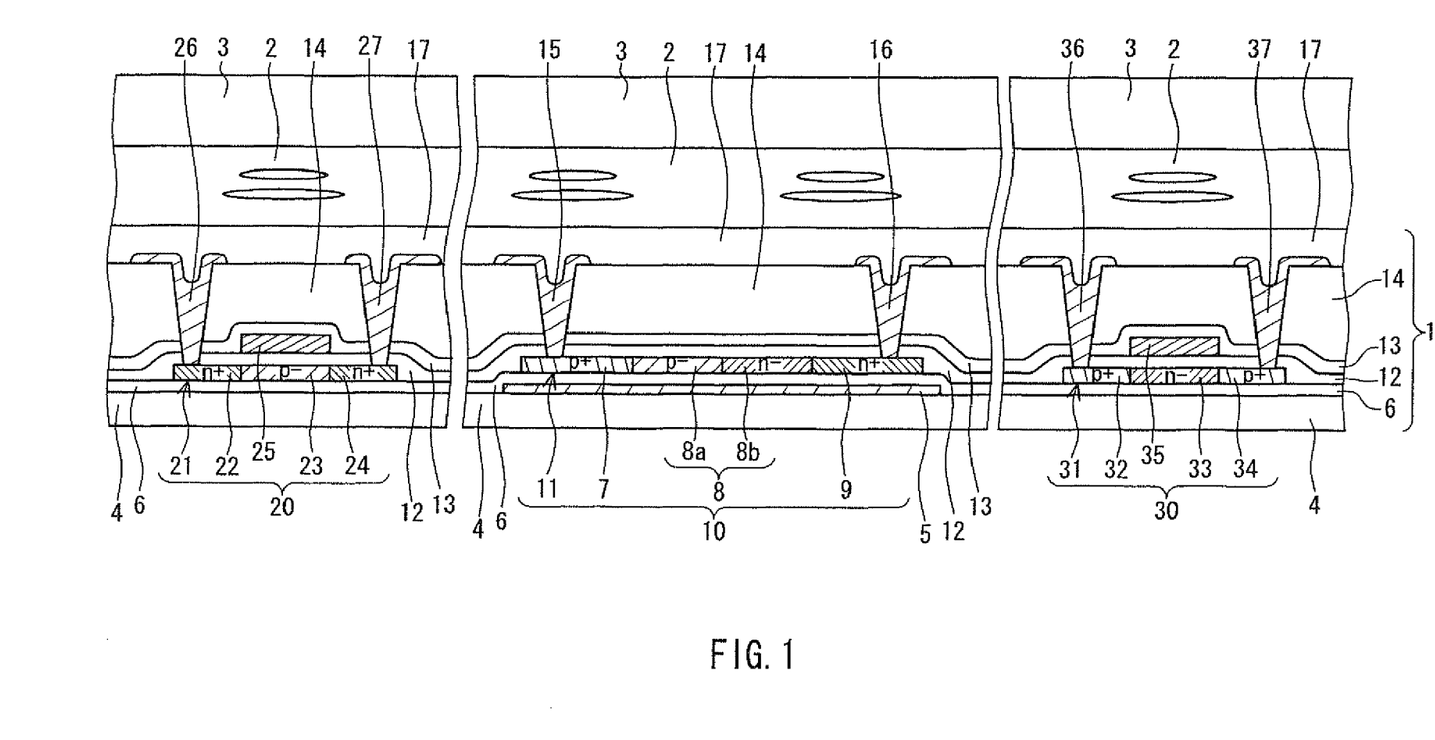
FIG. 1 is a cross-sectional view schematically showing a configuration of an active matrix substrate and a display device according to an embodiment of the present invention.
Figure 2:
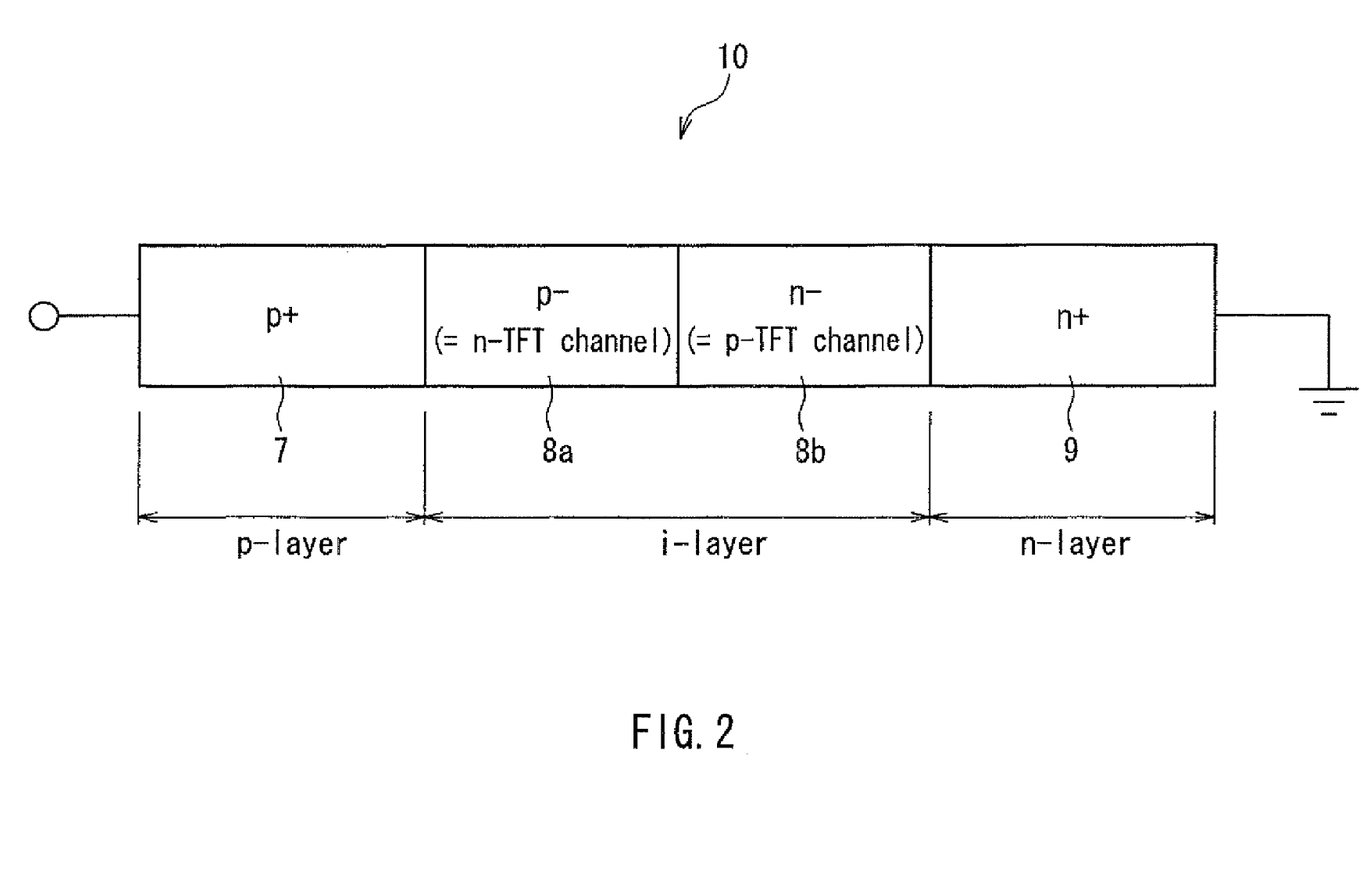
FIG. 2 shows a schematic configuration of a photodiode incorporated in the active matrix substrate and the display device according to the embodiment of the present invention.

Hereinafter, an active matrix substrate according to an embodiment of the present invention, a display device including the active matrix substrate, and a method for producing the display device will be described with reference to FIGS. 1 to 5. First, a configuration of the active matrix substrate and the display device according to the embodiment of the present invention will be described with reference to FIGS. 1 and 2. FIG. 1 is a cross-sectional view schematically illustrating a configuration of an active matrix substrate and a display device according to an embodiment of the present invention. FIG. 2 shows a schematic configuration of a photodiode incorporated in the active matrix substrate and the display device according to the embodiment of the present invention.

As shown in FIG. 1, the display device according to the present embodiment is a liquid crystal display device including an active matrix substrate 1 according to the present embodiment. The liquid crystal display device further includes a liquid crystal layer 2 and a counter substrate 3. The liquid crystal layer 2 is interposed between the active matrix substrate 1 and the counter substrate 3. The counter substrate 3 includes a counter electrode and color filters, which however are not shown. The color filters include a plurality of coloring layers corresponding to pixels, respectively. It should be noted that in the present embodiment the display device may be a display device other than a liquid crystal display device; it may be, for example, an EL display device.

The display device according to the present embodiment additionally includes a backlight serving as an it light source, a circuit substrate on which various types of IC chips are mounted, and the like, which however are not shown. The display device according to the present embodiment may be used as a display device provided in equipment of various types, such as a computer, a portable terminal device, a television receiver, and a car navigation system.

Further, as shown in FIG. 1, the active matrix substrate 1 includes n-type thin film transistors (n-TFTs) 20, p-type thin film transistors (p-TFTs) 30, and photodiodes 10. The n-TFTs 20, the p-TFTs 30, and the photodiodes 10 are formed monolithically on a glass substrate 4 as a basis for the active matrix substrate 1.

In the present embodiment, the n-TFTs 20 are arranged in matrix, and function as active elements. The p-TFTs 30 form parts of peripheral circuits (e.g., gate drivers and source drivers) for controlling the active elements. The photodiodes 10 in the present embodiment are arranged outside the area (display area) where the plurality of n-TFTs 20 are formed, and function as ambient sensors. In the display device, the brightness in the surroundings of the display device is detected based on signals outputted by the photodiodes 10, and a light amount of the backlight is adjusted in accordance with the detection result. Further, the embodiment may be such that a plurality of the photodiodes 10 are arranged per one or several pixels in the display area. In this embodiment, the plurality of photodiodes 10 function as area sensors.

Specific configurations of the n-TFTs 20, the p-TFTs 30, and the photodiodes 10 are described further. As shown in FIG. 1, the n-TFT 20 includes a silicon film 21. The silicon film 21 is formed on a basecoat film 6, which is insulative and covers the glass substrate 4. In the silicon film 21, an n-type semiconductor region that will become a source region 22, an n-type semiconductor region that will become a drain region 24, and a p-type semiconductor region that will become a channel region 23 are formed along an in-plane direction of the silicon film 21.

The p-TFT 30 includes a silicon film 31. Like the silicon film 21, the silicon film 31 also is formed on the basecoat film 6, which covers the glass substrate 4. In the silicon film 31, a p-type semiconductor region that will become a source region 32, a p-type semiconductor region that will become a drain region 34, and an n-type semiconductor region that will become a channel region 33 are formed along an in-plane direction of the silicon film 31.

Further, the photodiode 10 includes a silicon film 11. The silicon film 11 also is formed on the basecoat film 6. It should be noted that under the basecoat film 6, in a region where the basecoat film 6 overlaps the silicon film 11, a light blocking film 5 is formed further. The light blocking film 5 prevents illumination light of the backlight from entering the photodiode 10.

Still further, in the silicon film 11, a p-type semiconductor region (p-layer) 7, an intrinsic semiconductor region (i-layer) 8, and an n-type semiconductor region (n-layer) 9 are formed. The p-layer 7 and the n-layer 9 are arranged so as to sandwich the i-layer 8 in an in-plane direction of the silicon film 11. In the present embodiment also, the photodiode 10 is a PIN diode having a lateral structure, as is the case with a conventional photodiode (see FIG. 6).

In the present embodiment, however, the photodiode 10 is different from the conventional photodiode, regarding the configuration of the i-layer 8. As shown in FIGS. 1 and 2, the i-layer 8 includes, at a position adjacent to the p-layer 7, a p-type semiconductor region 8a in which a diffusion concentration of p-type impurities is set to the same level as a diffusion concentration of p-type impurities in the channel region 25 of the n-TFT 20. Further, the i-layer 8 includes, at a position adjacent to the n-layer 9, an n-type semiconductor region 8b in which a diffusion concentration of n-type impurities is set to the same level as a diffusion concentration of n-type impurities in the channel region 33 of the p-TFT 30.

In the present embodiment, the i-layer 8 is formed with a layer having a lower diffusion concentration of p-type impurities than that in the p-layer 7 and a layer having a lower diffusion concentration of n-type impurities than that in the n-layer 9. Therefore, the diffusion concentrations of the p-type impurities and the n-type impurities are not entirely uniform in the i-layer 8. However, the i-layer 8 as a whole is electrically neutral as compared with the p-layer 7 and the n-layer 9, and in the i-layer 8, the conductive electronic density and the positive hole density are equal. Therefore, the i-layer 8 also can function as a light detection region, like the i-layer 51b shown in FIG. 6.

In FIG. 1, "25" denotes a gate electrode of the n-TFT 20, and "35" denotes a gate electrode of the p-TFT 30. "12" and "13" denote interlayer insulation films, "14" denotes a flattening film, and "17" denotes a protective film. Lines 15 and 16 going through the flattening film 14, the interlayer insulation film 13, and the interlayer insulation film 12 are connected to the photodiode 10. Likewise, lines 26 and 27 are connected to the n-TFT 20, while lines 36 and 37 are connected to the p-TFT 30.

Figure 3A:
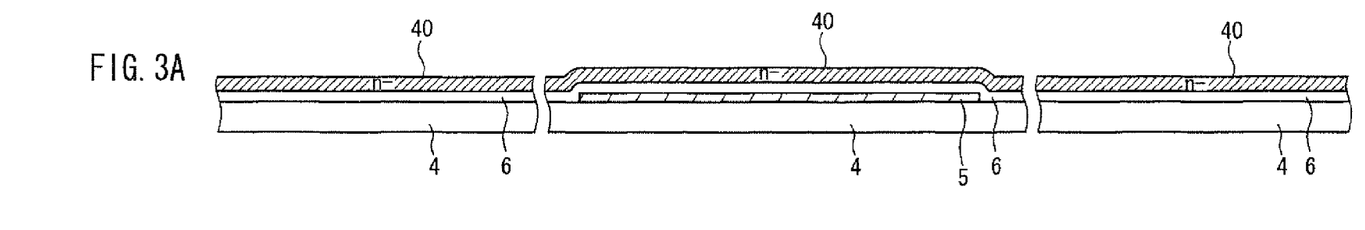
FIGS. 3A to 3C are cross-sectional views showing steps of a method for producing the active matrix substrate and the display device according to the embodiment of the present invention.
Figure 3B:
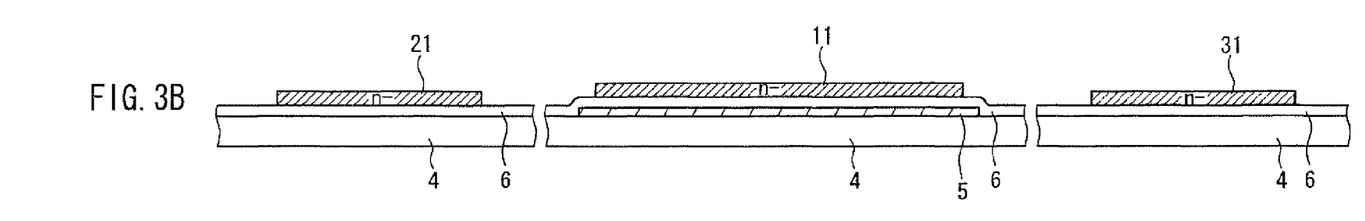
Figure 3C:
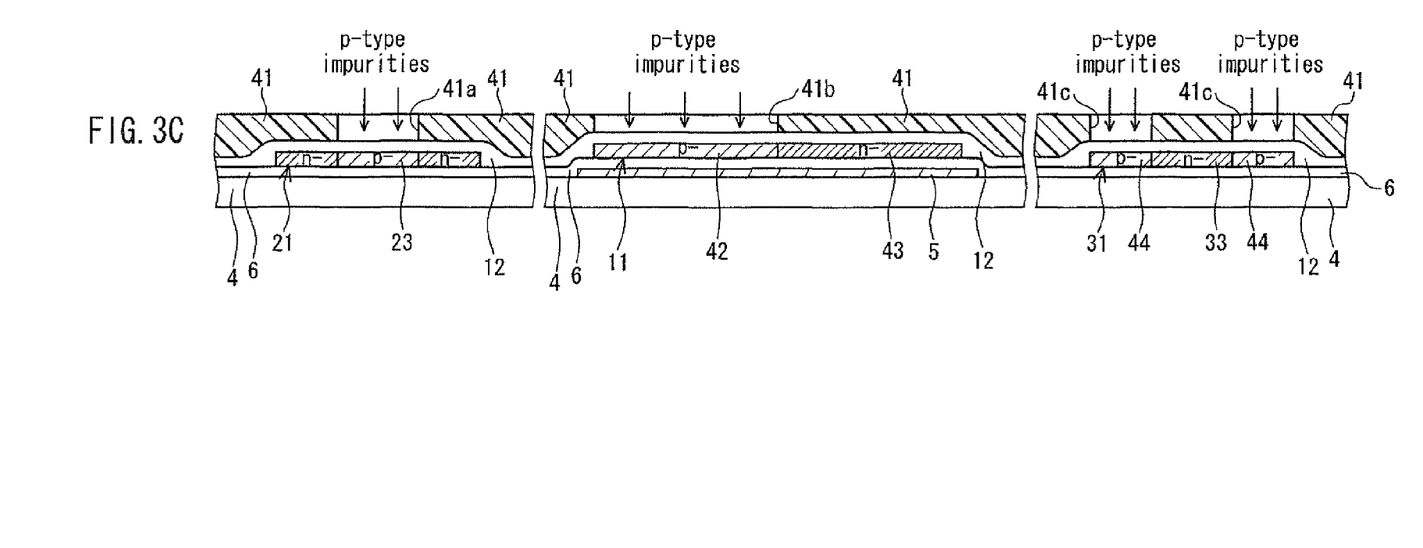
Figure 4A:
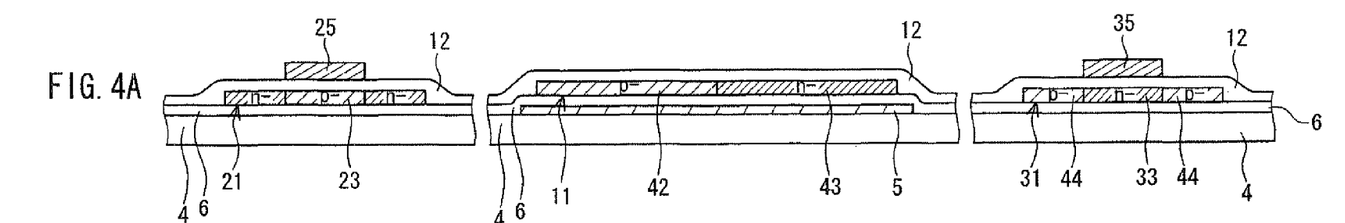
FIGS. 4A and 4B are cross-sectional views showing steps of the method for producing the active matrix substrate and the display device according to the embodiment of the present invention.
Figure 4B:
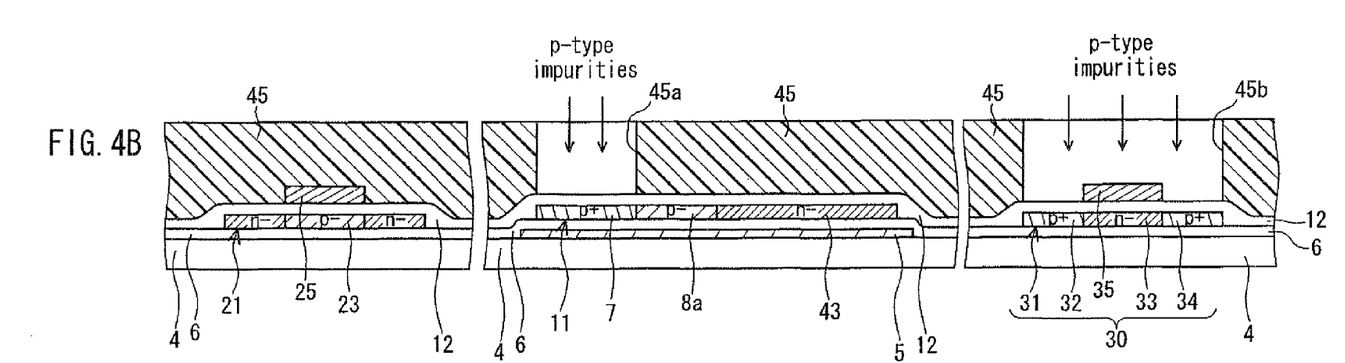
Figure 5A:
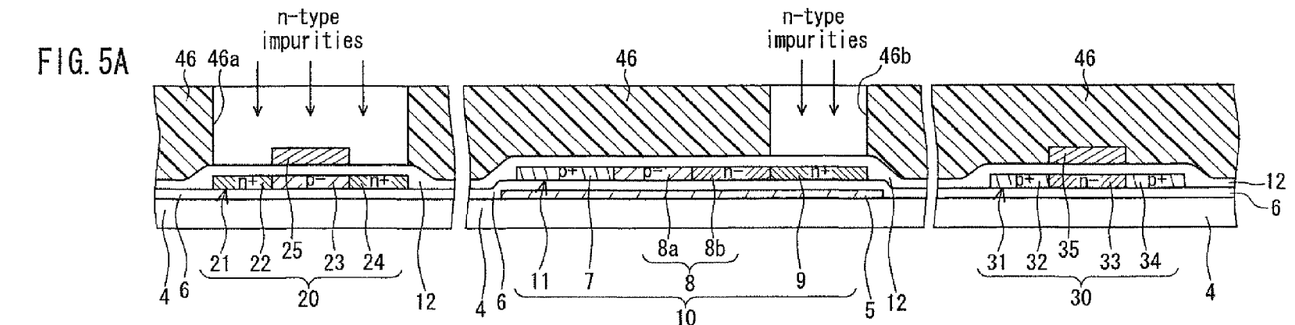
FIGS. 5A and 5B are cross-sectional views showing steps of the method for producing the active matrix substrate and the display device according to the embodiment of the present invention.
Figure 5B:
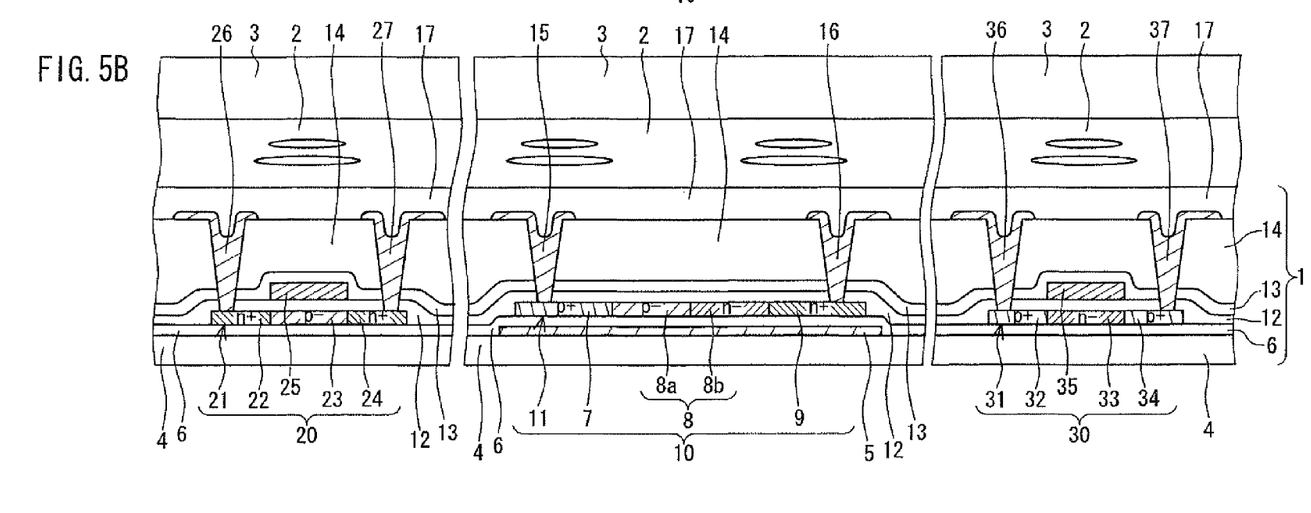

Next, a method for producing an active matrix substrate and a display device according an embodiment of the present invention will be described with reference to FIGS. 3 to 5. FIGS. 3 to 5 are cross-sectional views illustrating steps of a method for manufacturing an active matrix substrate and a display device according to an embodiment of the present invention. FIGS. 3A to 3C respectively illustrate serial principal steps of the producing method. FIGS. 4A and 4B illustrate serial principal steps of the producing method carried out after the step shown in FIG. 3C is finished. FIGS. 5A and 5B illustrate serial principal steps of the producing method carried out after the step shown in FIG. 4B is finished. In each of FIGS. 3 to 5, a step for producing the n-TFT is shown in the left-side part, a step for producing the photodiode is shown in the center part, and a step for producing the p-TFT is shown in the right-side part.

First, as shown in FIG. 3A, the light blocking film 5 is formed on the glass substrate 4 as a base substrate for the active matrix substrate 1, and the basecoat film 6, which is insulative, is formed so as to cover one of principal surfaces of the glass substrate 4 including the light blocking film 5. Subsequently, the silicon film 40 is formed so as to cover the basecoat film 6. In the present embodiment, the silicon film 40 has n-type conductivity.

More specifically, an insulation film such as a silicon oxide film or a silicon nitride film, or a metal film containing at least one of tantalum (Ta), titanium (Ti), tungsten (W), molybdenum (Mo), aluminum (Al), and the like, is formed on one of the principal surfaces of the glass substrate 4 by chemical vapor deposition (CVD), or sputtering, etc. Here, the film may have a thickness of, for example 50 nm or more.

Subsequently, a resist pattern (not shown) having an opening at a position where the light blocking film 5 made of a metal film is formed by photolithography, and the above-mentioned insulation film or metal film is etched using this resist pattern as a mask. As a result, the light blocking film 5 is obtained. It should be noted that the present embodiment may have a configuration without the light blocking film.

The basecoat film 6 can be formed of a silicon oxide film or a silicon nitride film formed by CVD. For example, in the case where the silicon oxide film is formed, CVD is carried out using $SiH_4$ gas and $N_2O$ gas (or $O_2$ gas) as a raw material gas. The basecoat film 6 may be a single layer or multilayer configuration. The thickness of the basecoat film 6 may be set at, for example, 100 nm to 500 mn.

The silicon film 40 can be formed by forming a film 40 of amorphous silicon, low-temperature polysilicon, or continuous-grain silicon. The silicon film 40 preferably is a continuous-grain silicon thin film since the mobility of electrons is high therein. In this case, specifically the silicon film 40 is formed in the following manner.

First, a silicon oxide film and an amorphous silicon film are formed in this order on the basecoat film 6. Next, a nickel thin film, acting as a catalyst for accelerating the crystallization, is formed on the top layer of the amorphous silicon film. Subsequently, the solid-phase growth annealing is carried out so that the nickel thin film and the amorphous silicon film are caused to react with each other, whereby a crystalline silicon layer is formed along the interface therebetween. Thereafter, non-reacted portions of the nickel film and a layer of nickel silicate are removed by etching or the like. Then, the remaining silicon film is subjected to laser annealing, and with crystallization promoted, a thin film of continuous grain silicon is completed. When the silicon film 40 is formed of continuous-grain silicon, the conductivity thereof is n-type.

Next, as shown in FIG. 3B, a part of the n-type silicon film 40 is removed, and the silicon film 11 forming the photodiode 10, the silicon film 21 forming the n-TFT 20, and the silicon film 31 forming the p-TFT 30 are formed. More specifically, the process is as follows. On the silicon film 40, a resist pattern (not shown) is formed. In the resist pattern, openings are formed in regions that coincide with the regions where the photodiode 10, the n-TFT 20, and the p-TFT 30 are to be formed, respectively. Then, etching is carried out using this resist pattern as a mask.

Next, as shown in FIG. 3C, the interlayer insulation film 12 is formed that covers the silicon film 11, the silicon film 21, and the silicon film 31. The interlayer insulation film 12 also, like the basecoat film 6, can be formed of a silicon oxide film or a silicon nitride film formed by CVD. The interlayer insulation film 12 also may be a single layer or multilayer configuration. The thickness of the interlayer insulation film 12 may be set at, for example, 10 nm to 120 nm. Portions of the interlayer insulation film 12 that coincide with the silicon film 21 and the silicon film 31, respectively, function as gate insulation films.

Subsequently, after the formation of the interlayer insulation film 12, ion implantation is earned out using p-type impurities such as boron (B) or indium (In), in order to form p-type semiconductor regions. This ion implantation is carried out in such a manner that a p-type semiconductor region having a low diffusion concentration is formed on each n-type silicon film.

More specifically, on the interlayer insulation film 12, a resist pattern 41 is formed. The resist pattern 41 has openings 41a to 41c. The opening 41a is provided above a portion of the silicon film 21 that will become a channel region 23. The opening 41b is provided above a portion of the silicon film 11 that will become the p-layer 7 and a portion of the i-layer 8 on the p-layer 7 side (a portion becoming the p-type semiconductor region 8a). The openings 41c are provided above the source region 44 and the drain region 44 of the silicon film 31.

When the ion implantation is carried out in this state, p-type impurities are introduced via the openings 41a to 41c of the resist pattern 41. As a result, in the silicon film 21, the channel region 23 of the n-TFT 20 is formed. A half of the silicon film 11 becomes the p-type semiconductor region 42 having a low diffusion concentration, while the p-type impurities are not introduced into the other half, and this other half becomes the n-type semiconductor region 43 having a low diffusion concentration.

Further, as for the silicon film 31, in portions thereof where the source region and the drain region are to be formed, two p-type semiconductor regions 44 having a low diffusion concentration are formed. In a region interposed between the two p-type semiconductor regions 44, the p-type impurities are not introduced, and this interposed region will become the channel region 33 of the p-TFT 30.

Here, the ion implantation preferably is carried out so that the diffusion concentration of the introduced p-type impurities is $1.5 \times 10^{20}$ [ions/cm$^3$] to $3 \times 10^{21}$ [ions/cm$^3$]. For example, the implantation energy is set at 10 [KeV] to 80 [KeV], and the dosage is set at $5 \times 10^{14}$ [ions] to $2 \times 10^{16}$ [ions]. The ion implantation carried out herein may be carried out through plural steps. After the ion implantation, the resist pattern 41 is removed.

Next, as shown in FIG. 4A, the gate electrode 25 is formed above the silicon film 21, at a position that coincides with the channel region 23, while the gate electrode 35 is formed above the silicon film 31, at a position that coincides with the channel region 33.

More specifically, first, a metal film is formed so as to cover the interlayer insulation film 12, the metal film predominantly containing at least one of tantalum (Ta), titanium (Ti), tungsten (W), molybdenum (Mo), aluminum (Al), and the like. This metal film may be formed by, for example, sputtering, vacuum evaporation, or the like. Subsequently, a resist pattern having openings in regions that coincide with the portion of the metal film that will become the gate electrode 25 and the portion thereof that will become the gate electrode 35 is formed by photolithography, and using this as a mask, etching is performed with respect to the metal film. Consequently, the gate electrode 25 and the gate electrode 35 are obtained.

Next, as shown in FIG. 4B, again, ion implantation is carried out using p-type impurities such as boron (B) or indium (In). This step is carried out in order to introduce additional p-type impurities to portions having insufficient diffusion concentrations of p-type impurities, among the p-type semiconductor regions formed in the step shown in FIG. 3A.

More specifically, a resist pattern 45 is formed. The resist pattern 45 have openings 45a and 45b. The opening 45a is provided above a portion that will become the p-layer 7 of the photodiode 10. The opening 45b is provided above a portion that will become the source region 32 and the drain region 34 of the p-TFT 30.

When the ion implantation is carried out in this state, p-type impurities are introduced via the openings 45a and 45b. As a result, the p-layer 7 of the photodiode 10, as well as the source region 32 and the drain region 34 of the p-TFT 30 are completed. In the present embodiment, the process of forming the p-layer 7 of the photodiode 10, the source region 32 and the drain region 34 of the p-TFT 30 is a process of the step shown in FIG. 3C and the step shown in FIG. 4B combined with each other. It should be noted that the channel region 33 of the p-TFT 30 is not covered with the resist pattern 45, but the gate electrode 35 present thereabove functions as a mask with respect to the channel region 33.

Here, the ion implantation preferably is carried out so that the diffusion concentration of the p-type impurities after the implantation has increased by about $1.5 \times 10^{20}$ [ions/cm$^3$] to $3 \times 10^{21}$ [ions/cm$^3$]. For example, the implantation energy is set at 10 [KeV] to 80 [KeV], and the dosage is set at $5 \times 10^{14}$ [ions] to $2 \times 10^{16}$ [ions]. After the ion implantation is finished, the resist pattern 45 is removed. The ion implantation in this case also may be carried out through plural steps.

Next, as shown in FIG. 5A, the ion implantation is carried out using n-type impurities such as phosphor (P) or arsenic (Ar). The ion implantation is intended to form the source region 22 and the drain region 24 in the n-TFT 20, and to form the n-layer 9 in the photodiode 10.

More specifically, a resist pattern 46 is formed on the interlayer insulation film 12. In the resist pattern 46, openings 46a and 46b are provided. The opening 46a is provided above portions that will become the source region 22 and the drain region 24 of the n-TFT 20. The opening 46b is provided above a portion that will become the n-layer 9 of the photodiode 10.

When the ion implantation is carried out in this state, n-type impurities are introduced via the openings 46a and 46b. As a result, the n-layer 9 of the photodiode 10, and the source region 22 and the drain region 24 of the n-TFT 20 are completed. It should be noted that the channel region 23 of the n-TFT 20 is not covered with the resist pattern 46, but the gate electrode 25 present thereabove functions as a mask with respect to the channel region 23.

Here, the ion implantation preferably is carried out so that the diffusion concentration of the n-type impurities after the implantation has increased by about $1.5 \times 10^{20}$ [ions/cm$^3$] to $3 \times 10^{21}$ [ions/cm$^3$]. For example, the implantation energy is set at 10 [KeV] to 100 [KeV], and the dosage is set at $5 \times 10^{14}$ [ions] to $1 \times 10^{16}$ [ions]. After the ion implantation is finished, the resist pattern 46 is removed. The ion implantation in this case also may be carried out through plural steps.

Next, as shown in FIG. 5B, another interlayer insulation film 13 is formed over the interlayer insulation film 12 so that the gate electrodes 25 and 35 are covered, and thereabove, the flattening film 14 is formed further. Subsequently, through holes are formed that go through the flattening film 14, the interlayer insulation film 13, and the interlayer insulation film 12, and are filled with a conductive material, whereby lines 15, 16, 26, 27, 36, and 37 are formed. Thereafter, a protective film 17 is formed that covers these lines and the flattening film 14, whereby the active matrix substrate 1 is obtained. Then, the counter substrate 3 is superposed on the active matrix substrate 1, with the liquid crystal layer 2 being interposed therebetween, whereby the liquid crystal display device is completed (see FIG. 1).

Incidentally, in the ion implantation steps shown in FIGS. 3C, 4B, and 5A, masks that prevent the introduction of p-type impurities and n-type impurities are provided above a portion that will become the n-type semiconductor region 8b of the i-layer 8 of the photodiode 10, and a portion that will become the channel region 33 of the p-TFT 30. In the present embodiment, additional impurities are not introduced to these portions, and hence, these portions are formed through fewer ion implantation steps than the other portions.

Further, the conductivity of the silicon film is n-type when it is formed (see FIG. 3A). The diffusion concentration of impurities in the n-type semiconductor region 8b of the photodiode 10, and the diffusion concentration of impurities in the channel region 33 of the p-TFT 30 do not vary since the formation of the silicon film 40, and these concentrations are set at the same level.

More specifically, in the present embodiment, a portion (n-type semiconductor region 8b) of the i-layer 8 adjacent to the n-layer 9 in the photodiode 10 can be formed without introduction of additional impurities, whereby variations in the diffusion concentration are reduced in the portion (8b) of the i-layer 8 adjacent to the n-layer 9, as compared with conventional cases. Further, consequently, variations in the energy gap at an interface between the i-layer 8 and the n-layer 9 also are smaller as compared with the conventional cases, whereby variations in the output characteristics of the photodiode 10 also are reduced.

Further, an example in which the silicon film 40 upon the formation has the n-type conductivity is described as the above-described embodiment, but the present invention is not limited to this example. The present invention may be such that the silicon film 40 has a p-type conductivity upon formation. In this case, the portion of the i-layer 8 adjacent to the p-layer 7 (p-type semiconductor region 8a), and the channel region 23 of the n-TFT 20 are formed without introduction of additional impurities. In this case, since variations in the diffusion concentration in the portion (8a) of the i-layer 8 adjacent to the p-layer 7 is reduced as compared with the conventional cases, variations in the energy gap at an interface between the i-layer 8 and the p-layer 7 are smaller. Therefore, in this case also, variations in the output characteristics of the photodiode 10 also are reduced.

INDUSTRIAL APPLICABILITY

The present invention, as an active matrix substrate and a display device, in which photodiodes as photosensors are incorporated, has industrial applicability.

The invention claimed is:

1. An active matrix substrate comprising an n-type thin film transistor, a p-type thin film transistor, and a photodiode,
wherein the n-type thin film transistor includes a silicon film in which an n-type semiconductor region that will become a source region, an n-type semiconductor region that will become a drain region, and a p-type semiconductor region that will become a channel region are formed,
the p-type thin film transistor includes a silicon film in which a p-type semiconductor region that will become a source region, a p-type semiconductor region that will become a drain region, and an n-type semiconductor region that will become a channel region are formed,
the photodiode includes a silicon film in which a p-type semiconductor region, an intrinsic semiconductor region, and an n-type semiconductor region are formed, and the p-type semiconductor region and the n-type semiconductor region of the photodiode are arranged so that the intrinsic semiconductor region is interposed therebetween in a plane direction of the silicon film of the photodiode, and
the intrinsic semiconductor region includes:
a p-type semiconductor region at a position adjacent to the p-type semiconductor region of the photodiode, said p-type semiconductor region having a diffusion concentration of p-type impurities that is set at the same level as that of a diffusion concentration of p-type impurities in the channel region of the n-type thin film transistor; and
an n-type semiconductor region at a position adjacent to the n-type semiconductor region of the photodiode, said n-type semiconductor region having a diffusion concentration of n-type impurities that is set at the same level as that of a diffusion concentration of n-type impurities in the channel region of the p-type thin film transistor.

2. A display device comprising an active matrix substrate, wherein the active matrix substrate comprises an n-type thin film transistor, a p-type thin film transistor, and a photodiode,
wherein the n-type thin film transistor includes a silicon film in which an n-type semiconductor region that will become a source region, an n-type semiconductor region that will become a drain region, and a p-type semiconductor region that will become a channel region are formed,
the p-type thin film transistor includes a silicon film in which a p-type semiconductor region that will become a source region, a p-type semiconductor region that will become a drain region, and an n-type semiconductor region that will become a channel region are formed,
the photodiode includes a silicon film in which a p-type semiconductor region, an intrinsic semiconductor region, and an n-type semiconductor region are formed, and the p-type semiconductor region and the n-type semiconductor region of the photodiode are arranged so that the intrinsic semiconductor region is interposed therebetween in a plane direction of the silicon film of the photodiode, and
the intrinsic semiconductor region includes:
a p-type semiconductor region at a position adjacent to the p-type semiconductor region of the photodiode, said p-type semiconductor region having a diffusion concentration of p-type impurities that is set at the same level as that of a diffusion concentration of p-type impurities in the channel region of the n-type thin film transistor; and
an n-type semiconductor region at a position adjacent to the n-type semiconductor region of the photodiode, said n-type semiconductor region having a diffusion concentration of n-type impurities that is set at the same level as that of a diffusion concentration of n-type impurities in the channel region of the p-type thin film transistor.

3. A method for producing a display device, comprising the steps of:
(a) forming an n-type silicon film on a base substrate for forming an active matrix substrate;
(b) removing a part of the n-type silicon film, and forming a first silicon film that will become an n-type thin film transistor, a second silicon film that will become a p-type thin film transistor, and a third silicon film that will become a photodiode;
(c) introducing n-type impurities into portions of the first silicon film that will become a source region and a drain region of the n-type thin film transistor, and a portion of the third silicon film that will become an n-type semiconductor region of the photodiode;
(d) introducing p-type impurities into portions of the second silicon film that will become a source region and a drain region of the p-type thin film transistor, and a portion of the third silicon film that will become a p-type semiconductor region of the photodiode; and
(e) introducing p-type impurities into a portion of the first silicon film that will become a channel region of the n-type thin film transistor, and a portion of the third silicon film that will become a part of an intrinsic region of the photodiode, the part being on a side to the p-type semiconductor region of the photodiode, in such a manner that a lower diffusion concentration of the p-type impurities than in the step (d) is obtained,
wherein in each of the steps (c) to (e), a mask for preventing introduction of the p-type impurities and the n-type impurities is provided over a portion of the second silicon film that will become a channel region of the p-type thin film transistor and a portion of the third silicon film that will become a part of the intrinsic semiconductor region of the photodiode, the part being on a side to the n-type semiconductor region of the photodiode.

4. A method for producing a display device, comprising the steps of:
(a) forming a p-type silicon film on a base substrate for forming an active matrix substrate;
(b) removing a part of the p-type silicon film, and forming a first silicon film that will become an n-type thin film transistor, a second silicon film that will become a p-type thin film transistor, and a third silicon film that will become a photodiode;
(c) introducing n-type impurities into portions of the first silicon film that will become a source region and a drain region of the n-type thin film transistor, and a portion of the third silicon film that will become an n-type semiconductor region of the photodiode;
(d) introducing p-type impurities into portions of the second silicon film that will become a source region and a drain region of the p-type thin film transistor, and a portion of the third silicon film that will become a p-type semiconductor region of the photodiode; and
(e) introducing n-type impurities into a portion of the second silicon film that will become a channel region of the p-type thin film transistor, and a portion of the third silicon film that will become a part of an intrinsic region of the photodiode, the part being on a side to the n-type semiconductor region of the photodiode, in such a manner that a lower diffusion concentration of the n-type impurities than in the step (c) is obtained, wherein in each of the steps (c) to (e), a mask for preventing introduction of the p-type impurities and the n-type impurities is provided over a portion of the first silicon film that will become a channel region of the n-type thin film transistor and a portion of the third silicon film that will become a part of the intrinsic semiconductor region of the photodiode, the part being on a side to the p-type semiconductor region of the photodiode.

* * * * *